United States Patent
Cheng et al.

(10) Patent No.: US 6,281,059 B1
(45) Date of Patent: Aug. 28, 2001

(54) METHOD OF DOING ESD PROTECTIVE DEVICE ION IMPLANT WITHOUT ADDITIONAL PHOTO MASK

(75) Inventors: Hsin-Li Cheng, Taipei; Chang-Da Yang, Chang Hua Hsien, both of (TW)

(73) Assignee: Worldwide Semiconductor Manufacturing Corp. (TW)

( * ) Notice: Subject to any disclaimer, the term of this patent is extended or adjusted under 35 U.S.C. 154(b) by 0 days.

(21) Appl. No.: 09/568,495

(22) Filed: May 11, 2000

(51) Int. Cl.[7] .................................................. H01L 21/336
(52) U.S. Cl. ............................................................. 438/200
(58) Field of Search ........................... 438/200, 201–208, 438/233, 587; 257/360

(56) References Cited

U.S. PATENT DOCUMENTS 5,262,344 * 11/1993 Mistry .................................. 438/200

OTHER PUBLICATIONS

Duvvury, C. McPhee, R.A. et al. "ESD Protection reliamility in 1 uM CMOS technologies" Annu. Proc., Reliab. Phys. [Symp.] (1986), 25th, 199–205. CODEN: ARLPBI; ISSN 0099–9512. CS Semiconduc. Adv. Dec., Texas Instrum. Inc. Houston, TX 77001, USA.*

* cited by examiner

Primary Examiner—Tuan H. Nguyen
Assistant Examiner—Craig Thompson

(57) ABSTRACT

A method of forming ESD protective transistor is disclosed, which is performed by ion implant into the drain contact hole of the ESD protective transistor, wherein the contact hole are fabricated simultaneously with the gate contact holes of the functional transistor and of the ESD protective transistor. Both of the transistors have a respective metal silicide layer cap the polysilicon layer to prevent depleted region formed in the poly-gate for ion implant using p type ions. The p type ions are to increase the instant current tolerance. Alternatively, the ion implant is using n type ions to increase the punchthrough ability of the ESD protective transistor. In the latter case, the metal silicide layer in the gate regions of both transistors is optional.

14 Claims, 3 Drawing Sheets

METHOD OF DOING ESD PROTECTIVE DEVICE ION IMPLANT WITHOUT ADDITIONAL PHOTO MASK

BACKGROUND OF THE INVENTION

1. Field of the Invention

The present invention relates to a ESD protection device design for semiconductor devices and, more particularly, to form ESD protective device by using an ion implant without additional photo mask.

2. Description of the Prior Art

With the popularity of the device features scaling down in the integrate circuit manufacturing, some of the problems such as hot carrier effect, punchthrough effect become stringent challenges. In addition, there are electrostatic discharge issues will be suffered. Since the gate oxide thickness of the MOS devices is decreased with the advance of the IC's technique. The thinner the gate oxide formed, the greater susceptibility for these devices come to damage from the excessive voltages such as caused by an electrostatic discharge (ESD) event. During an ESD event, charges are transferred from one or more pins of the integrated circuits into devices in a very short duration, typically less than one microsecond. The transfer charges generates voltages that are large enough to break down insulating films, e.g., gate oxides on MOSFET devices, or that can dissipate sufficient energy to cause thermal failures in the devices. Consequently, in order to overcome aforementioned problems, it is important to form ESD protective devices during manufacturing the functional devices.

Take the dynamic random access memories (DRAM) or static random access memories (SRAM) as an example, to improve the fabricated technology so as to increase the integrity per unit chip area and promote the competitive ability are a common target of the industries. Thus the tightly layout between the shallow trench isolation and the active region has become. For instance, FIG. 1 shows a MOSFET from the bottom to the up having a stack gate structure of gate oxide 10A, a polysilicon layer 10B, a tungsten silicide 10C and silicon nitride cap layer 10D, and a silicon nitride spacer 10E formed on the substrate 5. A silicon nitride liner layer 15 and an interlevel dielectric layer 30 are then atop the stack gate and all remaining areas. The silicon nitride liner layer 15 is to prevent the oxide layer in the shallow trench isolation 18 from the overetch during the source/drain 10F contact formation process. Since the active region (the source/drain region 10F) having the width is almost the same as the contact size so as to fully utilize the planar area and minimize the contact resistance. As a result, to avoid the overlay error during lithographic process, the silicon nitride liner 15 acts as an etching stop layer and the silicon nitride spacer 10E as the barrier of short between gate and the source/drain during contact formation. Because the cap layer 10D of about 1000 A compared to 300–400 A in thickness of the silicon nitride liner layer 15, another photoresist pattern define the gate contact is generally necessary. The results are shown in FIG. 1B.

As forgoing processes, as depicted before, a number of ESD protective transistors will be formed at the periphery of each die. The ESD protective transistors may form during DRAM or SRAM transistor device fabricate simultaneously or using extra processes to form in accordance with the process difference. However, the process difference, the extra lithographic process is generally demanded.

Thus, an object of the present invention is intended to provide a method to form the ESD protective transistor without additional lithographic process so as to reduce the cycle time and the cost.

SUMMARY OF THE INVENTION

An object of the present invention is to form ESD protective transistor by ion implant without additional photo mask.

The present invention discloses a method of forming ESD protective transistor, which is performed by ion implant into the drain contact hole of the ESD protective transistor, wherein the contact hole are fabricated simultaneously with the gate contact holes of the functional transistor and of the ESD protective transistor. Both of the transistors have a respective metal silicide layer cap the polysilicon layer to prevent depleted region formed in the poly-gate for ion implant using p type ions. The p type ions are to increase the ESD instant current tolerance. Alternatively, the ion implant is using n type ions to increase the punchthrough ability of the ESD protective transistor. In the latter case, the metal silicide layer in the gate regions of both transistors is optional.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

As depicted in the foregoing background of the invention, conventional ESD protective transistors are usually fabricated after the functional devices are partially completely formed, and additional lithographic processes are then done to form ESD protective transistors. The present invention discloses a method of about forming ESD protective transistor which is formed by perform an ion implant process into drain contact region. Since the contact region is formed simultaneously with the gate contact of the functional transistor and the contact of the drain contact and gate contact of the ESD protective transistor and thus no additional photo mask is need.

Figure 1A:
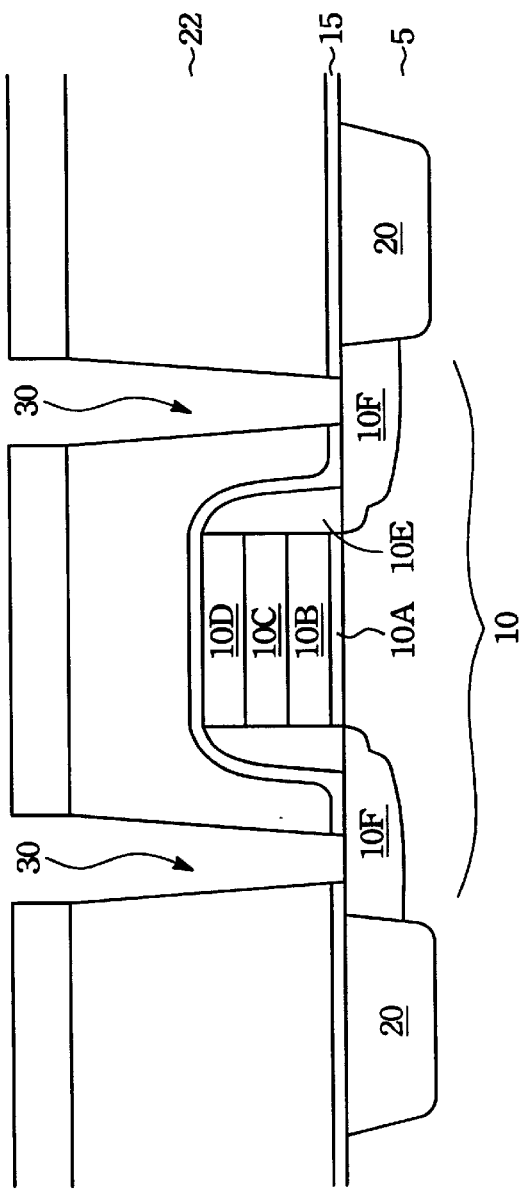
FIG. 1A is a cross-section view of forming source/drain contact holes of the functional transistor in accordance with the prior art.
Figure 1B:
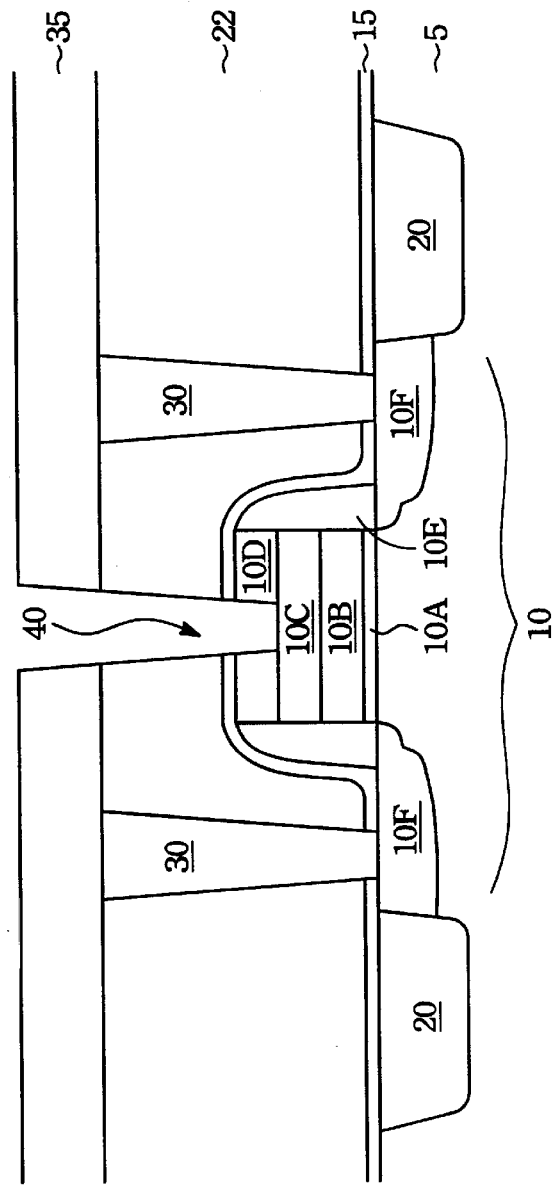
FIG. 1B is a cross-section view of forming gate contact holes of the functional transistor in accordance with the prior art.
Figure 2:
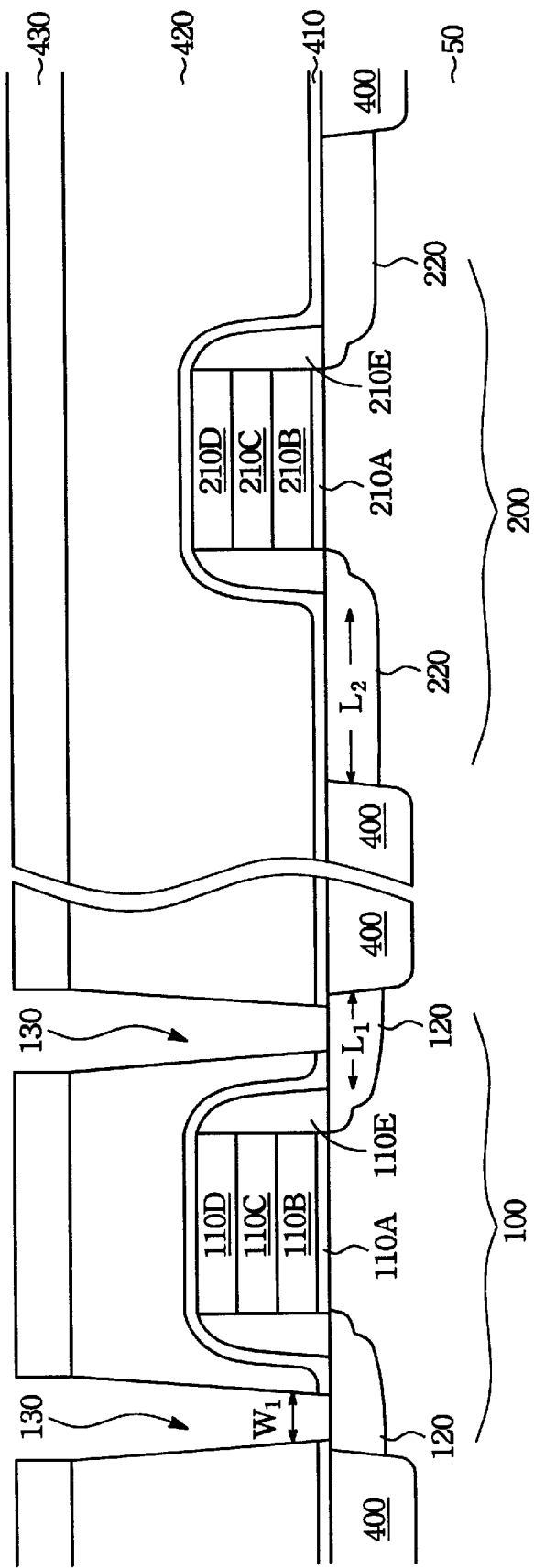
FIG. 2 is a cross-section view of forming source/drain contact holes of the functional transistor in accordance with the present invention.

Please refer to FIG. 2, a cross-sectional view, wherein region 100 is a functional region and region 200 is an ESD protective region. Both of regions comprise respectively one transistor thereon. The length of source/drain region or called active region 120 of the functional region 100 is small than the source/drain region 220 of the ESD region 200. As a result, the width W1 of the predetermined contact hole is easily overlap with the adjacent shallow trench isolation 400. However, it will not occur in the ESD region because the length of the source/drain is not necessary to layout as tightly as in the functional region 100. The ESD region 200 is usually formed at the periphery of a die and has larger scale so as to increase its instant current peak tolerance. The overlap issue can be neglected. But for DRAM or SRAM transistor, to reach a limitation set out by the design rule, it is common phenomena.

Still referring to FIG. 2, the transistor in the functional region 100 contains a gate stack from the bottom thereof, a gate oxide 110A, a polysilicon layer 110B, a metal silicide layer 110C, a silicon nitride layer 110D, and silicon nitride spacers 110E sequentially formed on the semiconductor substrate 50. The ESD protective transistor in the ESD protective region 100 contains also having a gate stack of a gate oxide 210A/a polysilicon layer 210B/a metal silicide layer 210C/a silicon nitride layer 210D/and silicon nitride spacers 210E. To the ESD protective region 100, the silicon nitride spacers 210E are optional. Both of transistors are then covered with a silicon nitride liner layer 410 and an interlevel dielectric layer (IDL) 420.

Thereafter, a photoresist pattern 430 is capped on the IDL 420 to define source/drain contact holes 130 of the functional transistor. An anisotropic etching is then performed to etch the IDL 420 using the silicon nitride liner layer 410 as an etching stop layer. The silicon nitride liner layer 410 as forgoing description is to lessen the oxide layer in the shallow trench region 400 being etched because the overlay error during lithographic process. The silicon nitride spacers is to prevent the contact hole 130 connect to the gate stack. Next, the silicon nitride liner layer 410 is breaking by etching so as to expose the source/drain region 120.

Figure 3:
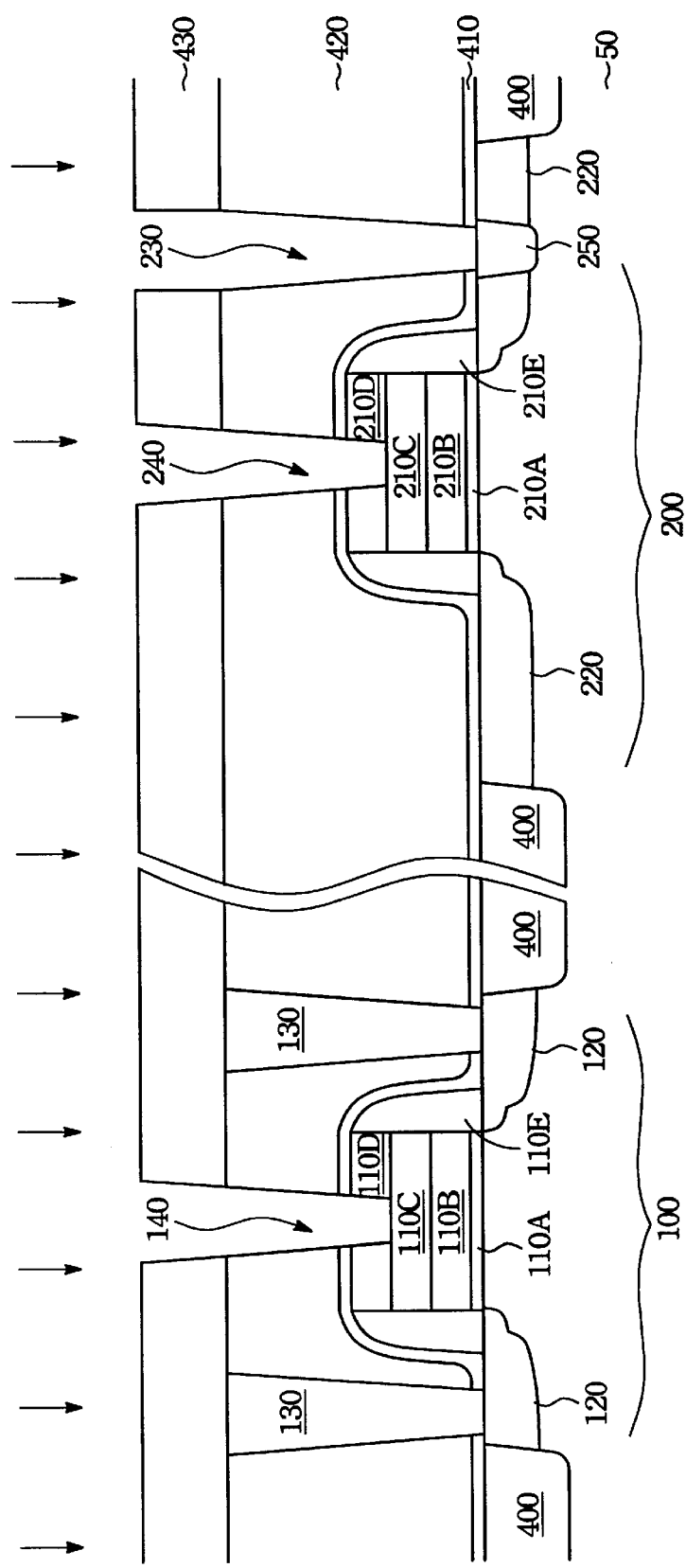
FIG. 3 is a cross-section view of forming gate contact holes of the functional transistor and of the ESD protective transistor as well as the drain contact hole of the ESD protective transistor, and then ion implant is performed in accordance with the present invention.

After stripping the residue photoresist 430, please refer to FIG. 3, a photoresist pattern 440 is then formed on the ILD 420. The pattern 440 is to define a gate contact 140 of the functional transistor, and a gate contact 230 of the ESD protective transistor as well as a contact 240 of the drain region 220 of the ESD protective transistor. Subsequently, an anisotropic etching is done to pattern ILD 420 using the silicon nitride liner layer 410, silicon cap layers as etching stop layers. A chemistry mixture for nitride layer breaking through is then done to etch the silicon cap layers 110D, 210D, which are about 1000 A in thickness, the metal silicide layer 110C, 210C and drain region 220 are then exposed so as to form the contact holes 140, 240, and 230.

Still referring to FIG. 3, after stripping the photoresist pattern 240, an ion implant is then performed by using p conductive ions. The ions are implanted into the contact holes 230, 240 and 130 to form a p-doped region 250 in the drain region 220 of the ESD protective region. Since the metal silicide layers 110C, and 210C act as barrier layers to prevent p conductive ions into the polysilicon layers 210B and 110B, the electrical depletion region will not formed. In a preferred embodiment, the energy and doses are, respectively, 50–80 keV and 1E15–4E15/cm2.

An object of forming the p-doped region 250 in the drain region 220 is to increase the instant current tolerance. Because the electrons will be blocked by the p-doped region 250, are thus not direct conducted from source region toward the drain region but are injected toward the region beneath the junction of the drain region.

Alternatively, the ion implant can also be performed using n conductive ions to form n-doped region 250 substitute for the p conductive ions. Furthermore, the metal silicide layers 110C and 210C are optional because it is not necessary to worry about forming electrical depletion region in the polysilicon layer. In the case of implanting by n conductive ions, the ion concentrations of drain region 220 are increased. Preferably, the energy and the dose, are of about 50–80 keV, and 2E15–4E15/cm2, respectively. The mechanism of preventing ESD event in the case of the n conductive ions is contrast to the p conductive ions. The former will prompt the punchthrough between the source and the drain regions 220 of the ESD protective transistor. Therefore, the ESD damage of the functional devices will be alleviated result from the breakdown voltage of the ESD protective transistor is reduced.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. An ESD protective transistor forming method, said method comprising the steps of:

providing a semiconductor substrate having a functional region and an ESD protective region, said functional region having a functional transistor with a gate stack from a bottom thereof, a gate oxide, a polysilicon layer, a metal silicide layer, a silicon nitride cap layer and a silicon nitride spacer, said ESD having a ESD protective transistor with a gate stack from a bottom thereof, a gate oxide, a polysilicon layer, a metal silicide layer, and a silicon nitride cap layer thereon, further, a silicon nitride liner layer and a interlevel dielectric layer formed atop said functional transistor, said ESD protective transistor and a remaining portion of said semiconductor substrate;

performing a first lithographic and etching process to pattern said interlevel dielectric layer so as to form contact holes for source/drain regions of said functional transistor connections;

performing a second lithographic and etching process to pattern said interlevel dielectric layer so as to form contact holes for gate stacks of said functional transistor and of said ESD protective transistor as well as a drain region of said ESD protective transistor connections; and performing an ion implant using p conductive ions into all areas of said semiconductor substrate so as to form a p-doped region in said drain region of said ESD protective transistor using said metal silicide layers of both transistors as barrier layers to prevent electrical depletion regions formed in both said polysilicon layers of both said transistors.

2. The method according to claim 1, wherein said silicon nitride liner layer has a thickness of about 300–600 A.

3. The method according to claim 1, wherein said silicon nitride cap layer has a thickness of about 1000–2000 A.

4. The method according to claim 1, wherein said first lithographic and etching process comprising the steps of:

forming a photoresist pattern on said interlevel dielectric layer to define contact holes for source/drain region of said functional transistor connection;

performing an anisotropic etching, using said photoresist pattern as a mask, said silicon nitride spacer as a barrier layer and said silicon nitride liner layer as a stop layer;

etching said silicon nitride liner layer so as to expose said semiconductor substrate so as to form said contact holes; and removing said photoresist pattern.

5. The method according to claim 1, wherein said second lithographic and etching process comprising the steps of:

forming a photoresist pattern on said interlevel dielectric layer to define contact holes for gate stacks of both said transistors and for drain of said ESD protective transistor connections;

performing an anisotropic etching, using said photoresist pattern as a mask, said silicon nitride spacer as a barrier layer and said silicon nitride liner layer as a stop layer;

etching said silicon nitride cap layer so as to expose said metal silicide layers of both said transistors so as to form said contact holes; and removing said photoresist layer.

6. The method according to claim 1, wherein said ion implant is with an energy and dose of about 50–80 keV and 1E15–4E15/cm2.

7. The method according to claim 1, wherein said a p-doped region is to distribute a portion of electron current which is from a source region to said drain region into a semiconductor substrate region under a gate channel of said ESD protective transistor.

8. An ESD protective transistor forming method, said method comprising the steps of:

providing a semiconductor substrate having a functional region and an ESD protective region, said functional region having a functional transistor with a gate stack from a bottom thereof, a gate oxide, a polysilicon layer, a silicon nitride cap layer and a silicon nitride spacer, said ESD having a ESD protective transistor with a gate stack from a bottom thereof, a gate oxide, a polysilicon layer, and a silicon nitride cap layer thereon, further, a silicon nitride liner layer and a interlevel dielectric layer formed atop said functional transistor, said ESD protective transistor and a remaining portion of said semiconductor substrate;

performing a first lithographic and etching process to pattern said interlevel dielectric layer so as to form contact holes for source/drain regions of said functional transistor connections;

performing a second lithographic and etching process to pattern said interlevel dielectric layer so as to form contact holes for gate stacks of said functional transistor and of said ESD protective transistor as well as a drain region of said ESD protective transistor connections; and performing an ion implant using n conductive ions into all areas of said semiconductor substrate so as to form a n-doped region in said drain region of said ESD protective transistor using said metal silicide layers of both transistors as barrier layers.

9. The method according to claim 8, wherein said silicon nitride liner layer has a thickness of about 300–600 A.

10. The method according to claim 8, wherein said silicon nitride cap layer has a thickness of about 1000–2000 A.

11. The method according to claim 8, wherein said first lithographic and etching process comprising the steps of:

forming a photoresist pattern on said interlevel dielectric layer to define contact holes for source/drain region of said functional transistor connection;

performing an anisotropic etching, using said photoresist pattern as a mask, said silicon nitride spacer as a barrier layer and said silicon nitride liner layer as a stop layer;

etching said silicon nitride liner layer so as to expose said semiconductor substrate so as to form said contact holes; and removing said photoresist pattern.

12. The method according to claim 9, wherein said second lithographic and etching process comprising the steps of:

forming a photoresist pattern on said interlevel dielectric layer to define contact holes for gate stacks of both said transistors and for drain of said ESD protective transistor connections;

performing an anisotropic etching, using said photoresist pattern as a mask, said silicon nitride spacer as a barrier layer and said silicon nitride liner layer as a stop layer;

etching said silicon nitride cap layer so as to expose said polysilicon layers of both said transistors so as to form said contact holes; and removing said photoresist layer.

13. The method according to claim 8, wherein said ion implant is with an energy and dose of about 50–80 keV and 2E15–4E15/cm2.

14. The method according to claim 8, wherein said a n-doped region is to increase n-type conductive ion concentration in said drain region of said ESD protective transistor so that said ESD protective transistor will easier to punch-through.

* * * * *